United States Patent [19]

Kuballa

[11] 4,139,727
[45] Feb. 13, 1979

[54] DEVICE FOR ATTACHING FLAT STRIP CABLES TO A PRINTED CIRCUIT BOARD

[75] Inventor: Siegfried Kuballa, Puchheim, Fed. Rep. of Germany

[73] Assignee: Siemens Aktiengesellschaft, Berlin and Munich, Fed. Rep. of Germany

[21] Appl. No.: 831,758

[22] Filed: Sep. 9, 1977

Related U.S. Application Data

[63] Continuation of Ser. No. 687,899, May 19, 1976, abandoned.

[30] Foreign Application Priority Data

May 22, 1975 [DE] Fed. Rep. of Germany ....... 2522755

[51] Int. Cl.² .................. H05K 1/10; H01R 13/58
[52] U.S. Cl. ..................... 174/68.5; 174/135; 339/17 F; 339/107; 339/210 M
[58] Field of Search ............. 174/68.5, 135, 156, 174/164, 166 R; 339/17 C, 17 L, , 17 F, 63 M, , 98, 128, 107, 174, 176 MF, 196 M, 208, 210 M; 361/400, 404, 408, 413

[56] References Cited

U.S. PATENT DOCUMENTS

| 2,587,239 | 2/1952 | Smith | 339/98 |
|---|---|---|---|
| 2,590,886 | 4/1952 | Pedersen | 339/107 |
| 3,432,802 | 3/1969 | Ritchie | 339/128 |
| 3,550,066 | 12/1970 | Cootes | 339/210 M X |
| 3,594,613 | 7/1971 | Prietula | 361/408 |
| 3,985,416 | 12/1976 | Dola et al. | 339/98 |

FOREIGN PATENT DOCUMENTS 2158254  6/1973  Fed. Rep. of Germany .......... 174/135

Primary Examiner—Laramie E. Askin
Attorney, Agent, or Firm—Hill, Gross, Simpson, Van Santen, Steadman, Chiara & Simpson

[57] ABSTRACT

The invention relates to a device for attaching flat strip cables to a printed circuit board to which the individual ends of the conductors in said cable are to be soldered. The device further provides for stress-relieving said solder connections in accordance with the teachings of the invention. Said device is further characterized by a split clamping element with two rake-like shaped parts assembled together in an interlocking fashion, the teeth of which in each part engage the voids in the corresponding other part forming therebetween a series of guide passages to accommodate a plurality of cable wires introduced therein.

6 Claims, 6 Drawing Figures

DEVICE FOR ATTACHING FLAT STRIP CABLES TO A PRINTED CIRCUIT BOARD

This is a continuation of application Ser. No. 687,899, filed May 19, 1976, now abandoned.

BACKGROUND OF THE INVENTION

1. Field of the Invention

The invention relates to a device, inexpensively manufactured preferably, in the form of plastic injection moldings, for efficiently connecting strip cables to a printed circuit board to which individual ends of the conductors of said cable projecting through said device are to be soldered. The device further provides stress-relieving characteristics in accordance with the teachings of the invention. Said device is further characterized by a split clamping element with two rake-like shaped parts assembled together in an interlocking fashion, the teeth of which in each part engage the voids in the corresponding other part forming therebetween a series of guide passages to accommodate a plurality of cable wires introduced therein.

2. Prior Art

In order to attach printed circuit boards carrying electrical components, it is necessary to arrange on the boards connecting lines which lead in and out of said boards. It is well known in the art to employ plug-in connections for this purpose on the common strip; these carrying the connecting pins which are to be soldered in position, in a pattern corresponding to the arrangement of the connecting holes in the printed circuit board. By simply placing the complete plug strip on to the circuit boards and subsequently soldering via a drawing or wave-soldering technique, all the connecting positions are contacted in an uncomplicated and reliable manner.

In addition to the utilization of plug-in strips, it is also well known and particularly advantageous because it obviates the need for a full plug-in connection, to lead the wires of said connecting cables directly to the contact locations on the circuit board, and solder them in position there. The introduction of the individual wires of these cables into the contact holes in the circuit boards is a tedious operation, whereby difficulties are encountered in maintaining the ends of said wires in position in the circuit board holes in order to carry out mechanical soldering. By way of connecting cables for printed circuit boards, so-called flat-strip cables are becoming more and more popular; in these the individual wires being disposed side by side in one plane.

SUMMARY OF THE INVENTION

The object of the present invention is to provide a device which enables efficient straightforward connection of flat-strip cables to reciprocal circuit boards.

A device which satisfies these requirements is characterized by a split clamping element with two rake-like shaped parts assembled together in interlocking fashion, the teeth of which in each case engage in the voids in the corresponding other parts, forming therebetween guide passages to accommodate a plurality of cable wires, wherein these passages, accommodating said flat-strip cable, extend in intervals spaced from one another which correspond to the spacing of the cable wires and terminate at the circuit board end at an offset spacing pattern corresponding to the contact holes in the board.

A device having these characteristics can be manufactured inexpensively in the form of plastic injecting moldings. The ends of the wires in the flat-strip cable, which have been separated from one another, are pressed by the teeth of the clamping components applied laterally to the flat-strip cable into the voids in the corresponding mating clamp components. When the clamping element components have been fully assembled together and secured thus by detent connections, said wires are held tightly in the guide passages thus formed in such a way that they exit from the clamping element in the direction of said circuit board to which they are to be connected in an offset spacing pattern corresponding to that of the contact holes in said board. By means of this device the ends of the wires projecting from the cables can be introduced simultaneously and without difficulty into the contact holes of the printed circuit boards.

DESCRIPTION OF THE PREFERRED EMBODIMENTS

Figure 1:
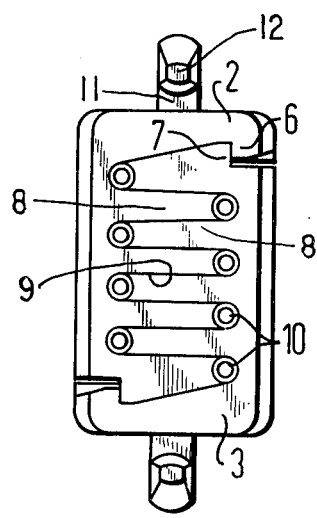
FIG. 1 is a plan view depicting the side profile of a clamping element which faces the circuit board having two identical clamping element components in accordance with the principles of the invention.
Figure 2:
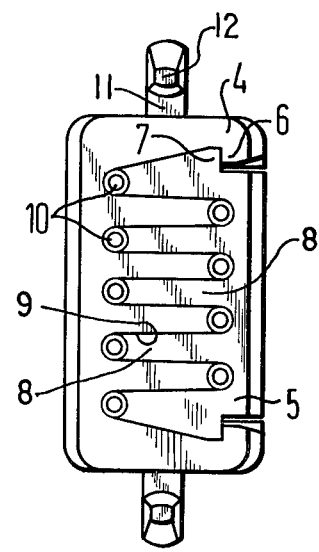
FIG. 2 is a plan view of a clamping element having unsymmetrical clamping components in accordance with the principles of the invention.
Figure 4:
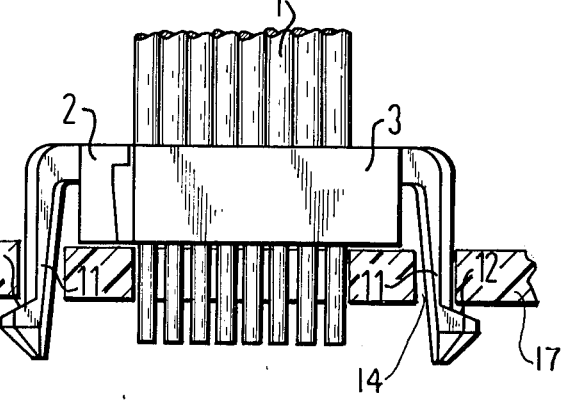
FIG. 4 is a view depicting the longitudinal side of a clamping element in accordance with the principles of the invention.
Figure 5:
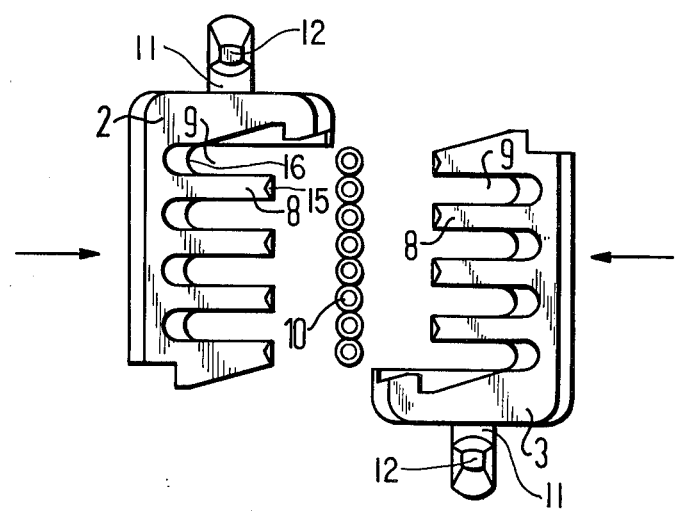
FIG. 5 is a view of an open clamping element depicting the relationship necessary for interconnection in accordance with the principles of the invention.
Figure 6:
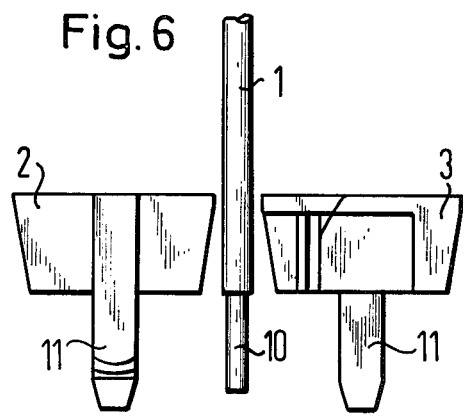
FIG. 6 is a view depicting the lateral face of an open clamping element in accordance with the principles of the invention.

A clamping element for a flat-strip cable 1 which is to be soldered to a circuit board 17 (shown in FIG. 4) comprises two identical clamping components 2, 3, as best shown at FIG. 1 and FIG. 5, having an inverted orientation, in respect to each other or two dissimilar clamping components 4, 5, as best shown at FIG. 2, assembled together in interlocking fashion through the agency of a pair of detent lugs 6, 7. The clamping components 2, 3, 4, 5, comprise a rake-like design such that a series of projecting teeth 8 on one component engage a series of voids 9 of the corresponding other component. Upon the intermeshing of the corresponding ends of the teeth 8 and said voids 9, serially allocated guide passages to accommodate the individual ends 10 of the cable wires 1 are formed. These guide passages are so aligned that at a circuit board end the ends 10 of said wires in the flat-strip cable 1 uniformly leave the clamping element at an offset spacing pattern corresponding to that of the contact holes in the circuit board 17. In order to facilitate said assembly of the ends 10 of the cable wires with the corresponding contact holes in the circuit boards, an intermediate plate (not shown herein) containing correspondingly allocated flared centering holes tapering toward the contact holes in the circuit board may be provided.

Figure 3:
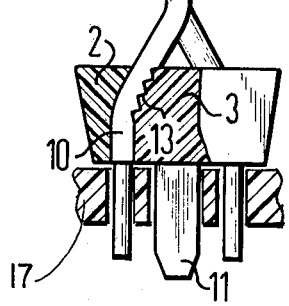
FIG. 3 is an end view of a partially sectioned clamping element in accordance with the principles of the invention.

In order to connect the clamping element to the circuit board for purposes of soldering the ends 10 of the cable wires to the leads on the circuit boards, and in order to relieve the stresses applied to these soldered connections, the clamping element is provided with a plurality of detent arms 11 as best seen at FIGS. 3 and 4, which engage in a plurality of corresponding detent holes 14 in the circuit boards. That detent surfaces 12 on said detent arms 11 are chamfered so that the clamping element is drawn into contact with said mating circuit board by the resultant wedging effect. In this way, a manufacturing inaccuracy can be compensated for. In order to increase the clamping action on the ends 10 of the wires in the guide passages, the teeth of the rake-like shaped clamping components 2, 3, contain notches 13.

The ends of the wires in said flat-strip cable 1, which have been separated from one another, are pressed by the teeth 8 of the clamping element components 2, 4, applied laterally to the flat-strip cable 1 into the voids 9 in the corresponding mating clamping elements 3, 5. When the clamping element components have been fully assembled together and secured thus by said detent lugs 6, 7, said wires are held tightly in the guide passages formed therebetween in such manner that they exit from the clamping element in the direction of the printed circuit board to which they are to be connected in an offset spacing pattern corresponding to that of the contact holes in the circuit board. The connecting holes in printed circuit boards are normally arranged next to one another at a 1/10th of an inch spacing. Because the spacing between the individual wires in conventional flat-strip cables is 1/20th of an inch, by means of said device each second wire of said cable 1 is located in one, distinct connecting plane, the teeth of each of said components 2, 3, 4, 5, can be arranged parallel to one another as best seen in FIG. 5. By means of this device, said ends 10 of the wires projecting from said cables can be introduced simultaneously and without difficulty into the contact holes in the printed circuit board.

The guide passages, as best seen at FIG. 3 at teeth 13, diverge from one another in the upper zone opposite a face contacting the circuit board, whereas in the exit zone of said ends 10, they are disposed parallel, as best seen at FIG. 4, to one another at an interval corresponding to the contact holes in the board. In this fashion, the best guidance and attachment conditions for the flat-strip cable ends are obtained.

In order that the clamping element shall be capable of withstanding the imposed mechanical loads and the thermal effects occurring during machine soldering, it is advantageous to use heat resistant fiberglass reinforced synthetic materials. To simplify handling of the clamping element, said clamping element is slightly tapered at the external surfaces in the direction of the circuit board. By designing the two interlocked rake-shaped clamping components as identical parts, the manufacturing and stockholding problems are reduced to a minimum.

As shown in FIG. 5, the ends of the teeth 8 may have a notch 15 therein and similarly the voids 9 may have circular notches 16.

While the fundamental novel features of the invention have been described as applied to preferred embodiments, it will be understood that various omissions and substitutions and changes in the form and details of the devices illustrated and in their operation may be made by those skilled in the art without departing from the spirit of the invention. It is the intention, therefore, to be limited only as indicated by the following claims.

I claim as my invention:

1. A split clamping element connection system non-removably attaching flat strip cable which is soldered to a circuit board, comprising in combination:
   a. a flat cable having a plurality of parallel conductors all lying in a common plane and spaced apart from one another by a predetermined distance, ends of said conductors having cable insulation removed therefrom;
   b. a circuit board having an offset solder connection hole spacing pattern, holes of said pattern being aligned in two spaced parallel planes, solder holes in each plane being spaced from one another approximately twice said predetermined distance, the holes of one plane being laterally offset with respect to holes of the other plane by approximately said predetermined distance, and said circuit board having detent aperture means for locking at opposite ends of the hole spacing pattern, said flat cable conductors being rigidly and non-removably connected in holes of said pattern;
   c. a split clamping element means for mechanically relieving solder connections in said connection holes and aligning ends of the cable conductors in said hole pattern for non-removable rigid solder connections, said clamping element having a cable insertion end face and a circuit board end face having two rake-like components assembled in an interlocking orientation, each rake-like component being symmetrical with respect to the other and having
      i. a plurality of teeth and a plurality of corresponding voids formed between said teeth;
      ii. guide passage means for said flat cable conductors being formed between ends of each of the teeth at the circuit board end face and the cable insertion end face, the guide passage means in a first zone between the circuit board end face and an intermediate plane being substantially perpendicular to said circuit board end face, and in a second zone between the intermediate plane and the cable insertion end face the guide passage means being formed in a straight line and at an acute angle with respect to the guide passage means in the first zone;
      iii. a locking barb projecting from an end tooth at one lateral side of the rake-like component and a complementary barb receiving indentation at an opposite lateral side of the rake-like component;
      iv. a detent locking arm means at one of said lateral sides received in one of said circuit board detent aperture means; and
   d. the assembled symmetrical rake-like components being interlocked by said locking barbs and barb receiving indentations and said guide passage means aligning said ends of the conductors in correspondence with the circuit board solder hole spacing pattern.

2. The system of claim 1 in which said passage means in the second zone each have notch means for increasing clamping action on the cable conductor therein.

3. The system of claim 1 in which entrances to the guide passage means in the assembled split clamping element at the cable insertion end face are positioned in first and second separated parallel line patterns.

4. A split clamping element connection system non-removably attaching flat strip cable which is soldered to a circuit board, comprising in combination:

a. a flat cable having a plurality of parallel conductors all lying in a common plane and spaced apart from one another by a predetermined distance, ends of said conductors having cable insulation removed therefrom;

b. a circuit board having an offset solder connection hole spacing pattern, holes of said pattern being aligned in two spaced parallel planes, solder holes in each plane being spaced from one another approximately twice said predetermined distance, the holes of one plane being laterally offset with respect to holes of the other plane by approximately said predetermined distance, and said circuit board having detent aperture means for locking at opposite ends of the hole spacing pattern, said flat cable conductors being rigidly and non-removably connected in holes of said pattern;

c. a split clamping element means for mechanically relieving solder connections in said connection holes and aligning ends of the cable conductors in said hole pattern for non-removable rigid solder connections, said clamping element having a cable insertion end face and a circuit board end face having two rake-like components assembled in an interlocking orientation, each rake-like component having
  i. a plurality of teeth and a plurality of corresponding voids formed between said teeth;
  ii. guide passage means for said flat cable conductors being formed between ends of each of the teeth at the circuit board end face and the cable insertion end face, the guide passage means in a first zone between the circuit board end face and an intermediate plane being substantially perpendicular to said circuit board end face, and in a second zone between the intermediate plane and the cable insertion end face the guide passage means being formed in a straight line and at an acute angle with respect to the guide passage means in the first zone;

d. one of the rake-like components having two locking barbs, one projecting from an end tooth at each of two opposite lateral sides of the rake-like component, and two complementary barb receiving indentations on the other rake-like component, one at each of two opposite lateral sides of the rake-like component;

e. a detent locking arm means at each of said opposite lateral sides of one of the rake-like components and received in said circuit board detent aperture means; and f. the assembled rake-like components being interlocked by said locking barbs and barb receiving indentations and said guide passage means aligning said ends of the conductors in correspondence with said circuit board solder hole spacing pattern.

5. The system of claim 4 in which said passage means in the second zone each have notch means for increasing clamping action on the cable conductor therein.

6. The system of claim 4 in which entrances to the guide passage means in the assembled split clamping element at the cable insertion end face are positioned in first and second separated parallel line patterns.

* * * * *